United States Patent [19]
Maley

[11] Patent Number: 6,054,888
[45] Date of Patent: Apr. 25, 2000

[54] LEVEL SHIFTER WITH PROTECTIVE LIMIT OF VOLTAGE ACROSS TERMINALS OF DEVICES WITHIN THE LEVEL SHIFTER

[75] Inventor: Reading Maley, San Francisco, Calif.

[73] Assignee: Advanced Micro Devices, Inc., Sunnyvale, Calif.

[21] Appl. No.: 09/165,911

[22] Filed: Oct. 2, 1998

[51] Int. Cl.$^7$ .............................................. H03K 19/0185
[52] U.S. Cl. ......................... 327/333; 327/320; 327/321; 326/68; 326/81; 361/90
[58] Field of Search .................................. 327/333, 309, 327/318, 319, 320, 321, 112; 326/63, 68, 80, 81, 83, 86; 361/56, 90, 91.5

[56] References Cited

U.S. PATENT DOCUMENTS

| | | | |
|---|---|---|---|
| 5,113,087 | 5/1992 | Ueno | 327/333 |
| 5,300,832 | 4/1994 | Rogers | 326/57 |
| 5,378,943 | 1/1995 | Dennard | 326/68 |
| 5,805,123 | 9/1998 | Satoh et al. | 345/60 |
| 5,864,244 | 1/1999 | Kaplinsky | 327/333 |
| 5,892,371 | 4/1999 | Maley | 326/81 |
| 5,969,542 | 10/1999 | Maley et al. | 326/81 |

OTHER PUBLICATIONS

Nakagome et al., "Circuit Techniques for 1.5–3.6–V Battery Operated 64–Mb DRAM", vol. 26, No. 7 IEEE, pp 1003–1009, 1991.

*Primary Examiner*—Timothy P. Callahan
*Assistant Examiner*—Terry L. Englund
*Attorney, Agent, or Firm*—Monica H. Choi

[57] ABSTRACT

A level shifter interfaces a digital system having devices designed for low operating voltages to an external system having higher operating voltages. The level shifter is comprised of two level shifting stages. Each level shifting stage includes a pull-up stack of a plurality of pull-up devices, coupled between a high power supply and a coupling node, which turn on when the coupling node is driven to a high shifted voltage, which is substantially the voltage at the high power supply, and which turn off when the coupling node is driven to a low shifted voltage, which is substantially the voltage at a low power supply. Each level shifting stage further includes a pull-down stack of a plurality of pull-down devices, coupled between the low power supply and the coupling node, which turn on when the coupling node is driven to the low shifted voltage and which turn off when the coupling node is driven to the high shifted voltage. Each level shifting stage further includes a clamping circuit, coupled to the coupling node and to a predetermined node of the plurality of pull-up and pull-down devices, for limiting voltage across terminals of each of the plurality of pull-up and pull-down devices by discharging down the predetermined node when the coupling node is driven to the low shifted voltage and by charging up the predetermined node when the coupling node is driven to the high shifted voltage. Thus, the level shifter shifts a lower core voltage range from the digital system to a higher shifted voltage range of the external system while limiting voltage across terminals of devices within the level shifter to prevent device breakdown and degradation.

22 Claims, 5 Drawing Sheets

LEVEL SHIFTER WITH PROTECTIVE LIMIT OF VOLTAGE ACROSS TERMINALS OF DEVICES WITHIN THE LEVEL SHIFTER

TECHNICAL FIELD

This invention relates to level shifters for digital systems, and more particularly, to a level shifter which shifts a lower range of core voltages to a higher range of shifted voltages while limiting the voltage across terminals of devices within the level shifter in order to protect such devices.

BACKGROUND OF THE INVENTION

A long-recognized important objective in the constant advancement of digital IC (Integrated Circuit) technology is faster speed and lower power dissipation. For example, a digital system such as a modern microprocessor is comprised of MOSFETs (Metal Oxide Semiconductor Field Effect Transistors) operating at a low rail-to-rail voltage of 1.5 V. In addition, at such a low operating voltage, the gate oxide is designed to be in the range of tens of angstroms (Å). Such a thin gate oxide is advantageous for smaller device geometry and for faster switching speed of the MOSFETs.

Furthermore, the digital system typically must interface with other electronic systems which operate at higher voltages. For example, typical communications systems operate at a rail-to-rail voltage of 3.3 V. Thus, when the digital system having the lower core voltage range of 1.5 V interfaces with the external system having the higher external voltage range of 3.3 V, a level shifter is used within the digital system to shift the lower core voltage range to the higher external voltage range.

However, the thin gate oxide of MOSFETs in the level shifter of the digital system may be adversely affected by the higher external voltage range of an external system. The gate oxide may break down if the gate is biased to a high operating voltage or the operating life time of a MOSFET having the thin gate oxide may be diminished if the gate is biased to a high operating voltage.

Nevertheless, a level shifter, within a digital system having MOSFETs with thin gate oxides, is needed to shift the lower core voltage range to the higher external voltage range when the digital system interfaces to the external system. However, since the level shifter is comprised of MOSFETs having thin gate oxide, a mechanism is desired for protecting the MOSFETs in the level shifter while the level shifter shifts the low core voltage range of the digital system to the higher external voltage range of the external system.

SUMMARY OF THE INVENTION

Accordingly, devices within the level shifter of the present invention are configured such that voltage across the terminals of such devices are limited.

In a general aspect, the present invention is a level shifter for shifting a core range of core input voltage between a low core voltage and a high core voltage to a higher shifted range between a low shifted voltage and a high shifted voltage, while limiting voltage across terminals of devices within the level shifter.

The level shifter of the present invention comprises a first shifting stage. The first shifting stage includes a first pull-up stack of a first plurality of pull-up devices, coupled between a high power supply and a first coupling node. The first plurality of pull-up devices turns on when the first coupling node is driven to the high shifted voltage that is substantially the voltage at the high power supply and turns off when the first coupling node is driven to the low shifted voltage that is substantially the voltage at a low power supply. Thus, a voltage difference between the first coupling node and the high power supply is distributed across the first plurality of pull-up devices when the first coupling node is driven to the low shifted voltage.

The first shifting stage also includes a first pull-down stack of a first plurality of pull-down devices, coupled between the low power supply and the first coupling node. The first plurality of pull-down devices turn on when the first coupling node is driven to the low shifted voltage and turn off when the first coupling node is driven to the high shifted voltage. Thus, a voltage difference between the first coupling node and the low power supply is distributed across the first plurality of pull-down devices when the first coupling node is driven to the high shifted voltage.

The first shifting stage further includes a first clamping circuit, coupled to the first coupling node and to a first predetermined node of the first plurality of pull-up and pull-down devices. The first clamping circuit limits voltage across terminals of each of the first plurality of pull-up and pull-down devices by discharging down the first predetermined node when the first coupling node is driven to the low shifted voltage and by charging up the first predetermined node when the first coupling node is driven to the high shifted voltage.

The level shifter of the present invention further comprises a second shifting stage. The second shifting stage includes a second pull-up stack of a second plurality of pull-up devices, coupled between the high power supply and a second coupling node. The second plurality of pull-up devices turns on when the second coupling node is driven to the high shifted voltage and turns off when the second coupling node is driven to the low shifted voltage. Thus, a voltage difference between the second coupling node and the high power supply is distributed across the second plurality of pull-up devices when the second coupling node is driven to the low shifted voltage.

The second shifting stage also includes a second pull-down stack of a second plurality of pull-down devices, coupled between the low power supply and the second coupling node. The second plurality of pull-down devices turns on when the second coupling node is driven to the low shifted voltage and turns off when the second coupling node is driven to the high shifted voltage. Thus, a voltage difference between the second coupling node and the low power supply is distributed across the second plurality of pull-down devices when the second coupling node is driven to the high shifted voltage.

The second shifting stage further includes a second clamping circuit, coupled to the second coupling node and to a second predetermined node of the second plurality of pull-up and pull-down devices. The second clamping circuit limits the voltage across terminals of each of the second plurality of pull-up and pull-down devices by discharging down the second predetermined node when the second coupling node is driven to the low shifted voltage and by charging up the second predetermined node when the second coupling node is driven to the high shifted voltage.

In the level shifter of the present invention, one of the first plurality of pull-up devices is cross-coupled to one of the second plurality of pull-up devices. Furthermore, the core input voltage is coupled to one of the first plurality of pull-down devices and is coupled via an inverter to one of the second plurality of pull-down devices. In this manner, the first coupling node is driven to the low shifted voltage and the second coupling node is driven to the high shifted voltage when the core input voltage is the high core voltage. The first coupling node is driven to the high shifted voltage and the second coupling node is driven to the low shifted voltage when the core input voltage is the low core voltage.

With the level shifter of the present invention, the shifted range between the low shifted voltage and the high shifted voltage is higher than the core range between the low core voltage and the high core voltage. Furthermore, the voltage across terminals of the devices within the level shifter of the present invention is limited to be below a predetermined voltage. Thus, the level shifter of the present invention may be used to particular advantage when implemented with CMOSFETs (Complementary Metal Oxide Semiconductor Field Effect Transistors) having thin gate oxides within a digital system having the lower core voltage range.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, and 5 refer to elements having similar structure and function.

DETAILED DESCRIPTION

The present invention is described for digital systems and level shifters implemented with CMOSFETs (Complementary Metal Oxide Semiconductor Field Effect Transistors). However, as would be apparent to one of ordinary skill in the art from the description herein, the present invention may be used for digital systems and level shifters implemented with any other type of devices having similar operating characteristics as CMOSFETs. In addition, the present invention is described with example voltage levels. However, as would be apparent to one of ordinary skill in the art from the description herein, the present invention may be used for other example voltage levels.

Figure 1:
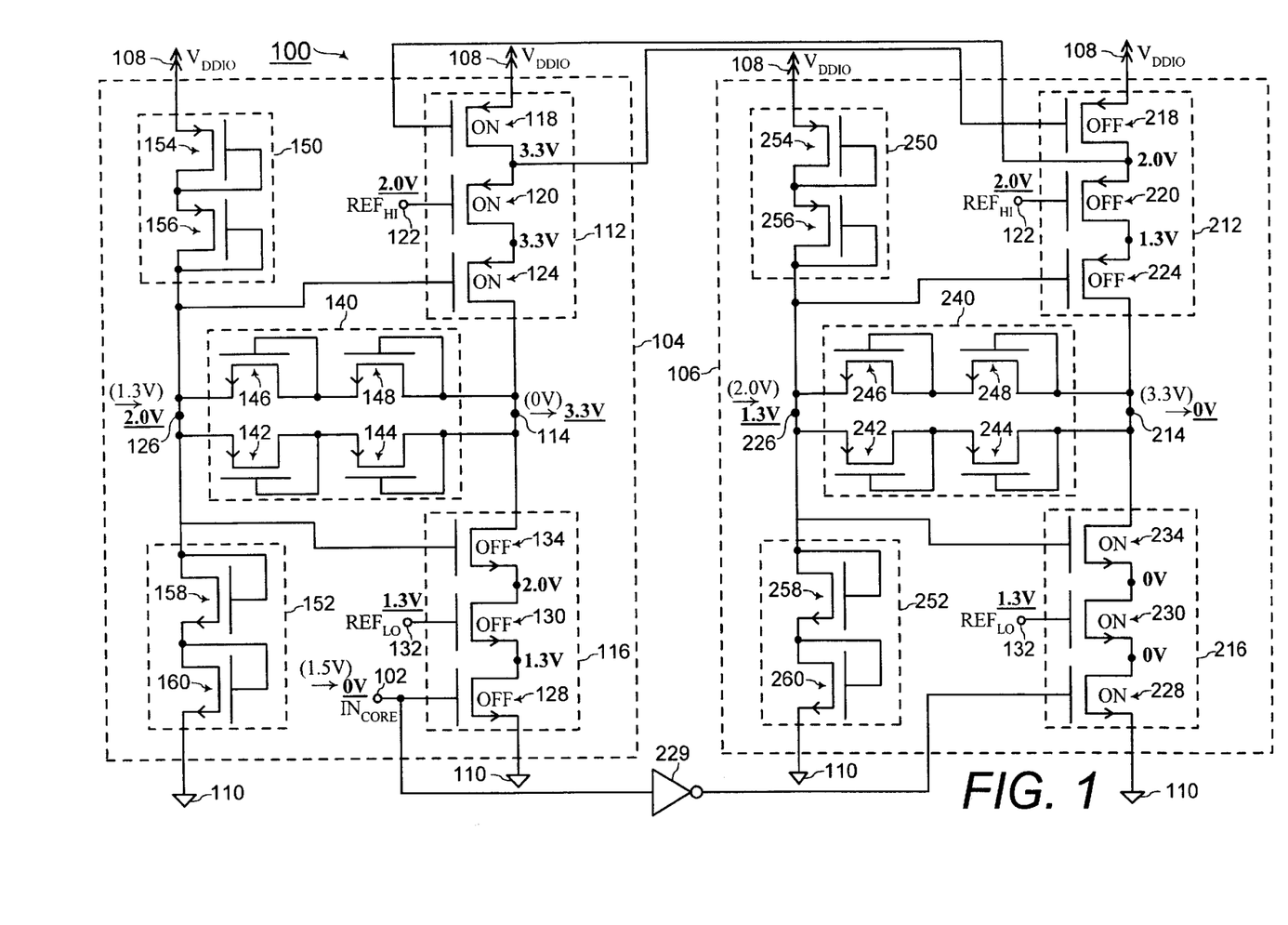
FIG. 1 shows a first embodiment of the present invention when a level shifter of the present invention shifts a low core voltage from a digital system to a higher external voltage range of an external system.

Referring to FIG. 1, a level shifter 100 of the present invention shifts a lower core voltage range of a digital system (such as a modem microprocessor) to a higher shifted voltage range. The higher shifted voltage range within the level shifter 100 is amenable for interfacing the digital system to an external system (such as a communications system) having a higher operating voltage range. For example, the digital system having the level shifter 100 may operate on a 1.5 V core voltage range while the level shifter 100 interfaces to a communications system operating on a 3.3 V external voltage range.

However, the MOSFETs (Metal Oxide Semiconductor Field Effect Transistors) within the digital system and the level shifter 100 have thin gate oxides of tens of angstroms (Å). Thus, the voltage across terminals of the MOSFETs within the level shifter 100 are limited for protection from device breakdown and/or degradation.

The level shifter 100 of FIG. 1 has a core input 102 for receiving a core input voltage from the digital system (such as a microprocessor) having the level shifter 100. The core input voltage is within a core voltage range of the digital system. The core voltage range is between a low core voltage of 0 V and a high core voltage of 1.5 V, for example.

The level shifter 100 shifts this lower core voltage range to a higher shifted voltage range of an external system (such as a communications system). The shifted voltage range is between a low shifted voltage of 0 V and a high shifted voltage of 3.3 V, for example.

The level shifter 100 of the present invention is comprised of two shifting stages: a first shifting stage 104 (shown within dashed lines) and a second shifting stage 106 (shown within dashed lines). The level shifter 100 is also coupled to a high power supply 108 $V_{DDIO}$=3.3 V and to a low power supply 110 of ground or 0 V. Such power supplies 108 and 110 may be provided via pins external to the digital system having the level shifter 100.

The first shifting stage 104 is comprised of a first pull-up stack 112 (shown within dashed lines) of a first plurality of pull-up devices coupled between the high power supply 108 and a first coupling node 114. The first shifting stage 104 also includes a first pull-down stack 116 (shown within dashed lines) of a first plurality of pull-down devices coupled between the low power supply 110 and the first coupling node 114.

In the embodiment of FIG. 1, the first plurality of pull-up devices in the pull-up stack 112 is a plurality of PMOSFETs (P-channel Metal Oxide Semiconductor Field Effect Transistors) coupled in series between the high power supply 108 and the first coupling node 114. The source of a first top PMOSFET 118 is coupled to the high power supply 108. The drain of the first top PMOSFET 118 is coupled to the source of a first middle PMOSFET 120.

The gate of the first middle PMOSFET 120 is coupled to a high reference voltage 122. For the example of the shifted voltage range of 0 V to 3.3 V, the high reference voltage 122 is 2.0 V and may be provided by any type of reference voltage source known to one of ordinary skill in the art. The drain of the first middle PMOSFET 120 is coupled to the source of a first bottom PMOSFET 124. The gate of the first bottom PMOSFET 124 is coupled to a first predetermined node 126, and the drain of the first bottom PMOSFET 124 is coupled to the first coupling node 114.

In the embodiment of FIG. 1, the first plurality of pull-down devices in the first pull-down stack 116 is a plurality of NMOSFETs (N-channel Metal Oxide Semiconductor Field Effect Transistors) coupled in series between the low power supply 110 and the first coupling node 114. The source of a first bottom NMOSFET 128 is coupled to the low power supply 110, and the gate of the first bottom NMOSFET 128 is coupled to the core input 102 for receiving the core input voltage. The drain of the first bottom NMOSFET 128 is coupled to the source of a first middle NMOSFET 130.

The gate of the first middle NMOSFET 130 is coupled to a low reference voltage 132. For the example of the shifted voltage range of 0 V to 3.3 V, the low reference voltage is 1.3 V and may be provided by any type of reference voltage source known to one of ordinary skill in the art. The drain of the first middle NMOSFET 130 is coupled to the source of a first top NMOSFET 134. The gate of the first top NMOSFET 134 is coupled to the first predetermined node 126, and the drain of the first top NMOSFET 134 is coupled to the first coupling node 114.

Additionally, the first shifting stage 104 further comprises a first clamping circuit 140 (shown within dashed lines) coupled between the first coupling node 114 and the first predetermined node 126. In the embodiment of FIG. 1, the first clamping circuit 140 is comprised of a plurality of diode connected PMOSFETs that are coupled in series between the first coupling node 114 and the first predetermined node 126. A first diode connected PMOSFET 142 and a second diode connected PMOSFET 144 are coupled in series between the first coupling node 114 and the first predetermined node 126. In addition, a plurality of diode connected NMOSFETs are coupled in series between the first coupling node 114 and the first predetermined node 126. A first diode connected NMOSFET 146 and a second diode connected NMOSFET 148 are coupled in series between the first coupling node 114 and the first predetermined node 126.

Furthermore, the first clamping circuit may further include a first pull-up bleeding circuit 150 (shown within dashed lines) and a first pull-down bleeding circuit 152 (shown within dashed lines). In the embodiment of FIG. 1, the first pull-up bleeding circuit 150 is comprised of a first diode-connected PMOSFET 154 and a second diode connected PMOSFET 156 that are coupled in series between the high power supply 108 and the first predetermined node 126. The first pull-down bleeding circuit 152 is comprised of a first diode-connected NMOSFET 158 and a second diode connected NMOSFET 160 that are coupled in series between the low power supply 110 and the first predetermined node 126.

The second shifting stage 106 is comprised of a second pull-up stack 212 (shown within dashed lines) of a second plurality of pull-up devices coupled between the high power supply 108 and a second coupling node 214. The second shifting stage 106 also includes a second pull-down stack 216 (shown within dashed lines) of a second plurality of pull-down devices coupled between the low power supply 110 and the second coupling node 214.

In the embodiment of FIG. 1, the second plurality of pull-up devices in the second pull-up stack 212 is a plurality of PMOSFETs (P-channel Metal Oxide Semiconductor Field Effect Transistors) coupled in series between the high power supply 108 and the second coupling node 214. The source of a second top PMOSFET 218 is coupled to the high power supply 108. The drain of the second top PMOSFET 218 is coupled to the source of a second middle PMOSFET 220.

The gate of the second middle PMOSFET 220 is coupled to the high reference voltage 122. For the example of the shifted voltage range of 0 V to 3.3 V, the high reference voltage 122 is 2.0 V and may be provided by any type of reference voltage source known to one of ordinary skill in the art. The drain of the second middle PMOSFET 220 is coupled to the source of a second bottom PMOSFET 224.

The gate of the second bottom PMOSFET 224 is coupled to a second predetermined node 226, and the drain of the second bottom PMOSFET 224 is coupled to the second coupling node 214.

In the embodiment of FIG. 1, the second plurality of pull-down devices in the second pull-down stack 216 is a plurality of NMOSFETs (N-channel Metal Oxide Semiconductor Field Effect Transistors) coupled in series between the low power supply 110 and the second coupling node 214. The source of a second bottom NMOSFET 228 is coupled to the low power supply 110, and the gate of the second bottom NMOSFET 228 is coupled to the core input 102 via an inverter 229. The drain of the second bottom NMOSFET 228 is coupled to the source of a second middle NMOSFET 230.

The gate of the second middle NMOSFET 230 is coupled to the low reference voltage 132. For the example of the shifted voltage range of 0 V to 3.3 V, the low reference voltage is 1.3 V and may be provided by any type of reference voltage source known to one of ordinary skill in the art. The drain of the second middle NMOSFET 230 is coupled to the source of a second top NMOSFET 234. The gate of the second top NMOSFET 234 is coupled to the second predetermined node 226, and the drain of the second top NMOSFET 234 is coupled to the second coupling node 214.

Additionally, the second shifting stage 106 further comprises a second clamping circuit 240 (shown within dashed lines) coupled between the second coupling node 214 and the second predetermined node 226. In the embodiment of FIG. 1, the second clamping circuit 240 is comprised of a plurality of diode connected PMOSFETs that are coupled in series between the second coupling node 214 and the second predetermined node 226. A first diode connected PMOSFET 242 and a second diode connected PMOSFET 244 are coupled in series between the second coupling node 214 and the second predetermined node 226. In addition, a plurality of diode connected NMOSFETs are coupled in series between the second coupling node 214 and the second predetermined node 226. A first diode connected NMOSFET 246 and a second diode connected NMOSFET 248 are coupled in series between the second coupling node 214 and the second predetermined node 226.

Furthermore, the second clamping circuit may further include a second pull-up bleeding circuit 250 (shown within dashed lines) and a second pull-down bleeding circuit 252 (shown within dashed lines). In the embodiment of FIG. 1, the second pull-up bleeding circuit 250 is comprised of a first diode-connected PMOSFET 254 and a second diode connected PMOSFET 256 that are coupled in series between the high power supply 108 and the second predetermined node 226. The second pull-down bleeding circuit 252 is comprised of a first diode-connected NMOSFET 258 and a second diode connected NMOSFET 260 that are coupled in series between the low power supply 110 and the second predetermined node 226.

Additionally, the first top PMOSFET 118 of the first pull-up stack 112 is cross-coupled to the second top PMOSFET 218 of the second pull-up stack 212. Thus, the gate of the first top PMOSFET 118 is coupled to the drain of the second top PMOSFET 218. The drain of the first top PMOSFET 118 is coupled to the gate of the second top PMOSFET 218.

The operation of the level shifter 100 of the present invention is now described. The level shifter 100 shifts a high core voltage of 1.5 V at the core input 102 to a high shifted voltage of 3.3 V at the second coupling node 214. Furthermore, the level shifter 100 shifts a low core voltage of 0 V at the core input 102 to a low shifted voltage of 0 V at the second coupling 214.

Referring to FIG. 1, assume that the low core voltage of 0 V is at the core input 102. In that case, 0 V is coupled to the gate of the first bottom NMOSFET 128. In addition, if the inverter 229 operates from a power source of 1.5 V, then 1.5 V is coupled to the gate of the second bottom NMOSFET 228.

With 0 V coupled to the gate of the first bottom NMOSFET 128, the first pull-down stack 116 is turned off, and the first bottom NMOSFET 128, the first middle NMOSFET 130, and the first top NMOSFET 134 are turned off. With 1.5 V coupled to the gate of the second bottom NMOSFET 228, the second pull-down stack 216 is turned on, and the second bottom NMOSFET 228, the second middle NMOSFET 230, and the second top NMOSFET 234 are turned on.

With the first top PMOSFET 118 of the first pull-up stack 112 cross-coupled to the second top PMOSFET 218 of the second pull-up stack 212, the level shifter 100 is in equilibrium with the first pull-up stack 112 turned on and with the second pull-up stack 212 turned off. Thus, the first top PMOSFET 118, the first middle PMOSFET 120, and the first bottom PMOSFET 124 of the first pull-up stack 112 are turned on. The second top PMOSFET 218, the second middle PMOSFET 220, and the second bottom PMOSFET 224 of the second pull-up stack 212 are turned off.

With the first pull-up stack 112 turned on and the first pull-down stack 116 turned off, the first coupling node 114 charges up to a high shifted voltage of 3.3 V which is substantially the voltage at the high power supply 108 of $V_{DDIO}$=3.3 V. With the second pull-up stack 212 turned off and the second pull-down stack 216 turned on, the second coupling node 214 discharges down to a low shifted voltage of 0 V which is substantially the voltage at the low power supply or the ground node 110.

As the first coupling node 114 charges up to the high shifted voltage of 3.3 V, the first predetermined node 126 is initially at 1.3 V. Because of this large voltage drop of 2.0 V across the first clamping circuit 140, the diode connected NMOSFETs 146 and 148 within the first clamping circuit 140 turn on to charge up the first predetermined node 126. The first predetermined node 126 charges up toward 2.0 V. When the voltage at the first predetermined node reaches 2.0 V, the voltage difference between the first coupling node 114 and the first predetermined node 126 is approximately 2 $V_{TH}$ of the NMOSFETs 146 and 148 within the first clamping circuit 140. Thus, an equilibrium is reached, and the first predetermined node 126 remains at 2.0 V while the NMOSFETs 146 and 148 with the first clamping circuit 140 turn back off.

In this manner, with the first predetermined node 126 at 2.0 V, the gate of the first bottom PMOSFET 124 within the first pull-up stack 112 and the gate of the first top NMOSFET 134 within the first pull-down stack 116 are raised to 2.0 V. With the high shifted voltage of 3.3 V at the drain of those transistors, a higher voltage of 2.0 V at their gates limits the voltage across the gate to drain terminals of those transistors. Thus, the first clamping circuit 140 charges up the first predetermined node 126 in reaction to the high shifted voltage at the first coupling node 114 to protect the gates of the first bottom PMOSFET 124 and the first top NMOSFET 134 that are coupled to the coupling node 114 having the higher shifted voltage range.

With the first clamping circuit 140, the voltage across the gate to drain terminals of the first bottom PMOSFET 124 and the first top NMOSFET 134 is approximately 1.3 V. The voltage across terminals of the MOSFETs within the digital system having the level shifter 100 are limited to be below approximately 1.65 V to protect the thin gate oxide of those MOSFETs from breakdown or degradation.

In addition, voltage across terminals (i.e., gate to drain terminals or gate to source terminals) of the other MOSFETs within the first shifting stage 104 are also limited to be below approximately 1.65 V. In the first pull-down stack 116, because the NMOSFETs 128, 130, and 134 within the pull-down stack 116 are turned off, the source terminals of each NMOSFET charges to a voltage such that the gate to source voltage is approximately 0 V. (Note that the gate to source voltage is the respective $V_{TH}$ which is approximately several hundred millivolts for each of the NMOSFETs 128, 130, and 134. However, for simplicity of illustration and description, the gate to source voltage for each of the NMOSFETs 128, 130, and 134 is approximated to be 0 V in the description herein.)

For the first bottom NMOSFET 128, the gate to source voltage $V_{GS}$ is 0 V. With a reference voltage of 1.3 V at the gate of the first middle NMOSFET 130, the source of the first middle NMOSFET 130 charges to approximately 1.3 V. Thus, the $V_{GS}$ of the second NMOSFET 130 is approximately 0 V, and the gate to drain voltage of the first bottom NMOSFET 128 is approximately −1.3 V. With the voltage of 2.0 V at the first predetermined node 126 and thus at the gate of the first top NMOSFET 134, the source of the first top NMOSFET 134 charges to approximately 2.0 V. Thus, the $V_{GS}$ of the first top NMOSFET 134 is approximately 0 V, and the gate to drain voltage of the first middle NMOSFET 130 is approximately −0.7 V. In this manner, the voltage difference between the first coupling node 114 and the low power supply 110 is thus distributed across the NMOSFETs 128, 130, and 134 of the first pull-down stack 116 when the first coupling node 114 is driven to the high shifted voltage of 3.3 V.

In the first pull-up stack 112, because the PMOSFETs 118, 120, and 124 within the first pull-up stack 112 are turned on, the drain and source terminals of each the PMOSFETs 118, 120, and 124 are at 3.3 V. The gate voltage of each of the PMOSFETs 118, 120, and 124 is 2.0 V. Thus, the voltage across the gate to source terminals or across the gate to drain terminals of each of the PMOSFETs 118, 120, and 124 is −1.3 V.

For the first clamping circuit 140, a voltage drop of 1.3 V is distributed across the diode connected PMOSFETs 142 and 144 and the diode connected NMOSFETs 146 and 148 within the first clamping circuit 140. Thus, voltage across the gate to source terminals of such diode connected transistors are limited to be below 1.65 V.

The first pull-up bleeding circuit 150 bleeds charge on to the first predetermined node 126 from the high power supply 108 to maintain voltage at the first predetermined node 126 above a minimum voltage (typically near the low reference voltage of 1.3 V). Otherwise without the first pull-up bleeding circuit 150, if the voltage at the first predetermined node 126 falls below the minimum voltage, then the level shifter circuit 100 of FIG. 1 may not recover to proper operation.

Similarly, the first pull-down bleeding circuit 152 bleeds charge away from the first predetermined node 126 to the low power supply 110 to maintain voltage at the first predetermined node 126 below a maximum voltage (typically near the high reference voltage of 2.0 V). Otherwise without the first pull-down bleeding circuit 152, if the voltage at the first predetermined node 126 rises above the maximum voltage, then the level shifter circuit 100 of FIG. 1 may not recover to proper operation.

In addition, the first pull-up bleeding circuit 150 and the first pull-down bleeding circuit 152 ensure proper channel formation within the MOSFETs 142, 144, 146, and 148 within the first clamping circuit 140.

When the first predetermined node 126 is charged up to 2.0 V, a voltage of 2.0 V is distributed across the diode connected NMOSFETs 158 and 160 in the first pull-down bleeding circuit 152. The voltage across the gate to source terminals of each of the NMOSFETs 158 and 160 is approximately 1.0 V. A voltage of 1.3 V is distributed across the diode connected PMOSFETs 154 and 156 in the first pull-up bleeding circuit 150. The voltage across the gate of source terminals of each of the PMOSFETs 154 and 156 is approximately 0.65 V. Thus, the voltage across the gate to source terminals of each transistor in the bleeding circuits 150 and 152 is limited to be below 1.65 V.

Similarly in the second shifting stage 106, with the second pull-up stack 212 turned off and the second pull-down stack 216 turned on, the second coupling node 214 discharges down to a low shifted voltage of 0 V which is substantially the voltage at the low power supply 100. As the second coupling node 214 discharges down to the low shifted voltage of 0 V, the second predetermined node 226 is initially at 2.0 V. Because of this large voltage drop of 2.0 V across the second clamping circuit 240, the diode connected PMOSFETs 242 and 244 within the second clamping circuit 240 turn on to discharge down the second predetermined node 226. The second predetermined node 226 discharges down toward 1.3 V. When the voltage at the second predetermined node reaches 1.3 V, the voltage difference between the second coupling node 214 and the second predetermined node 226 is approximately 2 $V_{TH}$ of the PMOSFETs 242 and 244 within the second clamping circuit 240. Thus, an equilibrium is reached, and the second predetermined node 226 remains at 1.3 V while the PMOSFETs 242 and 244 turn back off.

In this manner, with the second predetermined node 226 at 1.3 V, the gate of the second bottom PMOSFET 224 within the second pull-up stack 212 and the gate of the second top NMOSFET 234 within the second pull-down stack 216 are lowered to 1.3 V. With the low shifted voltage of 0 V at the drain of those transistors, a lower voltage of 1.3 V at their gates limits the voltage across the gate to drain terminals of those transistors. Thus, the second clamping circuit 240 discharges down the second predetermined node 226 in reaction to the low shifted voltage at the second coupling node 214 to protect the gates of the second bottom PMOSFET 224 and the second top NMOSFET 234 that are coupled to the second coupling node 214 having the higher shifted voltage range.

With the second clamping circuit 240, the voltage across the gate to drain terminals of the second bottom PMOSFET 224 and the second top NMOSFET 234 is approximately 1.3 V. The voltage across terminals of the MOSFETs within the digital system having the level shifter 100 are limited to be below approximately 1.65 V to protect the thin gate oxide of those MOSFETs from breakdown or degradation.

In addition, voltage across terminals (i.e., gate to drain terminals or gate to source terminals) of the other MOSFETs within the second shifting stage 106 are also limited to be below approximately 1.65 V. In the second pull-up stack 212, because the PMOSFETs 218, 220, and 224 within the pull-up stack 212 are turned off, the source terminals of each such PMOSFET charges to a voltage such that the source to gate voltage is approximately 0 V. (Note that the source to gate voltage is the respective $V_{TH}$ which is approximately several hundred millivolts for each of the PMOSFETs 218, 220, and 224. However, for simplicity of illustration and description, the source to gate voltage for each of the PMOSFETs 218, 220, and 224 is approximated to be 0 V in the description herein.)

For the second bottom PMOSFET 224, the source to gate voltage $V_{SG}$ is approximately 0 V. With a voltage of 1.3 V from the second predetermined node 226 coupled to the gate of the second bottom PMOSFET 224, the source of the second bottom PMOSFET 224 charges to approximately 1.3 V such that the $V_{SG}$ of that transistor is approximately 0 V. In addition, with the second coupling node discharged down to 0 V, the gate to drain voltage of the second bottom PMOSFET 224 is 1.3 V.

With the high reference voltage of 2.0 V at the gate of the second middle PMOSFET 220, the gate to drain voltage of the second middle PMOSFET 220 is 0.7 V. In addition, the source of the second middle PMOSFET 220 charges to approximately 2.0 V. Thus, the $V_{SG}$ of the second middle PMOSFET 220 is approximately 0 V.

The gate of the second top PMOSFET 218 is coupled to the drain of the first top PMOSFET 118. Since the first top PMOSFET 118 is turned on, the gate of the second top PMOSFET 218 is charged to 3.3 V. Thus, the $V_{SG}$ of the second top PMOSFET 218 is 0 V, and the gate to drain voltage of the second top PMOSFET 218 is approximately 1.3 V.

In the second pull-down stack 216, because the NMOSFETs 228, 230, and 234 within the second pull-down stack 216 are turned on, the drain and source terminals of each the NMOSFETs 228, 230, and 234 are at 0 V. The gate voltage of the second middle and top NMOSFETs 230 and 234 is at 1.3 V. Thus, the voltage across the gate to source terminals or across the gate to drain terminals of each of those NMOSFETs 230 and 234 is 1.3 V. The gate voltage of the second bottom NMOSFET 228 is at 1.5 V. Thus, the gate to source voltage and the gate to drain voltage of the second bottom NMOSFET 228 are 1.5 V.

For the second clamping circuit 240, a voltage drop of 1.3 V is distributed across the diode connected PMOSFETs 242 and 244 and the diode connected NMOSFETs 246 and 248 within the second clamping circuit 240. Thus, voltage across the gate to source terminals of such diode connected transistors are limited to be below 1.65 V.

The second pull-up bleeding circuit 250 bleeds charge on to the second predetermined node 226 from the high power supply 108 to maintain voltage at the second predetermined node 226 above a minimum voltage (typically near the low reference voltage of 1.3 V). Otherwise without the second pull-up bleeding circuit 250, if the voltage at the second predetermined node 226 falls below the minimum voltage, then the level shifter circuit 100 of FIG. 1 may not recover to proper operation.

Similarly, the second pull-down bleeding circuit 252 bleeds charge away from the second predetermined node 226 to the low power supply 110 to maintain voltage at the second predetermined node 226 below a maximum voltage (typically near the high reference voltage of 2.0 V). Otherwise without the second pull-down bleeding circuit 252, if the voltage at the second predetermined node 226 rises above the maximum voltage, then the level shifter circuit 100 of FIG. 1 may not recover to proper operation.

In addition, the second pull-up bleeding circuit 250 and the second pull-down bleeding circuit 252 ensure proper channel formation within the MOSFETs 242, 244, 246, and 248 within the second clamping circuit 240.

When the second predetermined node 226 is discharged down to 1.3 V, a voltage of 2.0 V is distributed across the diode connected PMOSFETs 254 and 256 in the second pull-up bleeding circuit 250. The voltage across the gate to source terminals of each of the PMOSFETs 254 and 256 is approximately 1.0 V. A voltage of 1.3 V is distributed across the diode connected NMOSFETs 258 and 260 in the second pull-down bleeding circuit 252. The voltage across the gate to source terminals of each of the NMOSFETs 258 and 260 is approximately 0.65 V. Thus, the voltage across the gate to source terminals of each transistors in the second bleeding circuits 250 and 252 is limited to be below 1.65 V.

In this manner, the level shifter 100 shifts the low core voltage of 0 V at the core input 102 to the low shifted voltage of 0 V at the second coupling node 214 while limiting the gate oxide voltage of each of the MOSFETs within the level shifter 100 to be below the voltage of 1.65 V. Thus, the level shifter 100 may be implemented using thin gate oxide MOSFETs designed for use in a digital system having low operating voltages.

Figure 2:
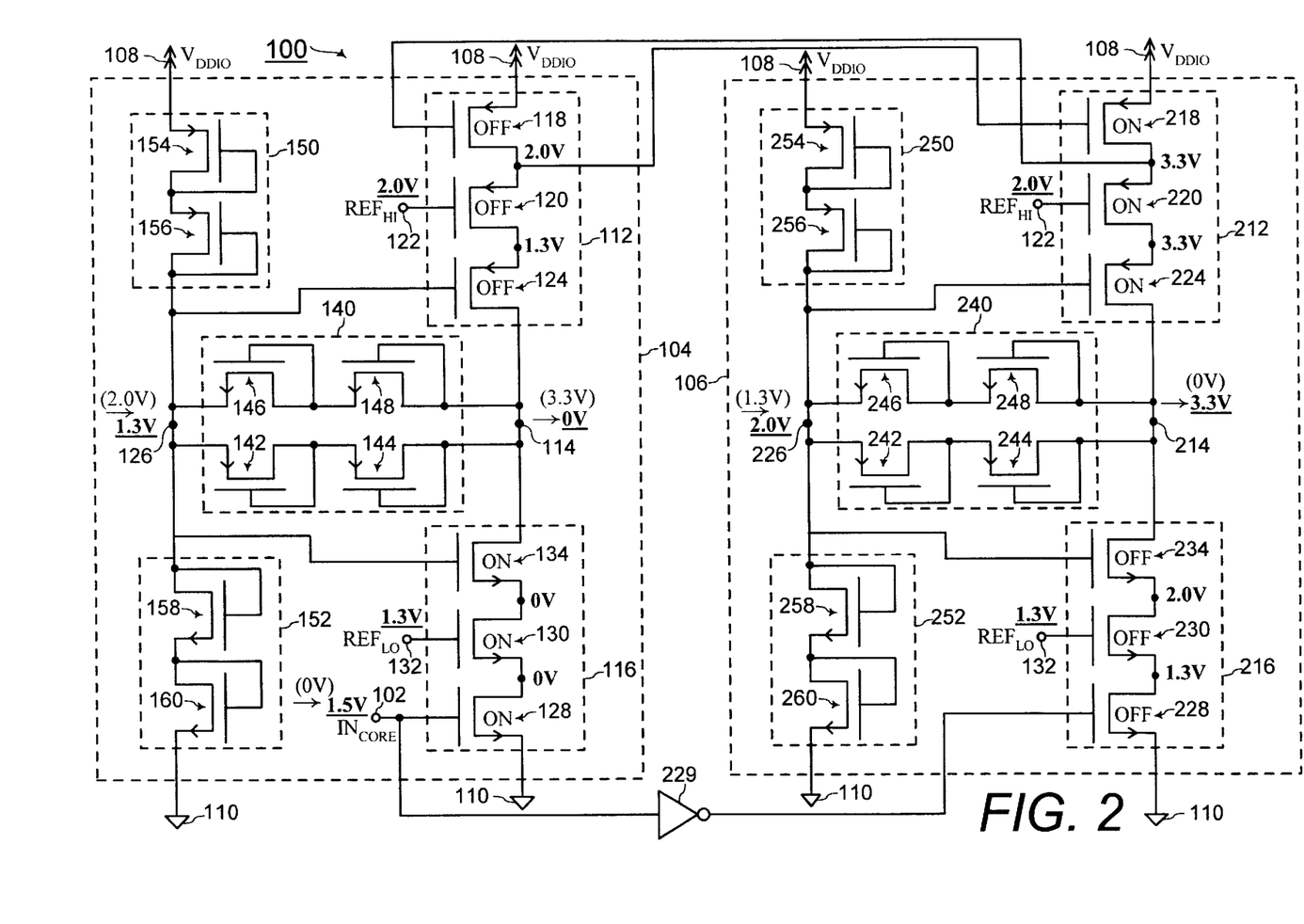
FIG. 2 shows the first embodiment of the present invention as shown in FIG. 1 when the level shifter of the present invention shifts a high core voltage from the digital system to the higher external voltage range of the external system.

Similarly, FIG. 2 shows the operation of the level shifter 100 of FIG. 1 when a high core voltage of 1.5 V is at the core input 102. Elements having the same reference number in FIGS. 1 and 2 refer to elements having similar structure and function.

Referring to FIG. 2, with 1.5 V coupled to the gate of the first bottom NMOSFET 128, the first pull-down stack 116 is turned on, and the first bottom NMOSFET 128, the first middle NMOSFET 130, and the first top NMOSFET 134 are turned on. With 0 V coupled to the gate of the second bottom NMOSFET 228, the second pull-down stack 216 is turned off, and the second bottom NMOSFET 228, the second middle NMOSFET 230, and the second top NMOSFET 234 are turned off.

With the first top PMOSFET 118 of the first pull-up stack 112 cross-coupled to the second top PMOSFET 218 of the second pull-up stack 212, the level shifter 100 is in equilibrium with first pull-up stack 112 turned off and with the second pull-up stack 212 turned on. Thus, the first top PMOSFET 118, the first middle PMOSFET 120, and the first bottom PMOSFET 124 of the first pull-up stack 112 are turned off. The second top PMOSFET 218, the second middle PMOSFET 220, and the second bottom PMOSFET 224 of the second pull-up stack 212 are turned on.

With the first pull-up stack 112 turned off and the first pull-down stack 116 turned on, the first coupling node 114 discharges down to the low shifted voltage of 0 V. With the second pull-up stack 212 turned on and the second pull-down stack 216 turned off, the second coupling node 214 charges up to the high shifted voltage of 3.3 V.

In this manner, the voltage at the terminals of the MOSFETs in the first shifting stage 104 in FIG. 2 are biased similarly to the second shifting stage 106 in FIG. 1, as shown in FIG. 2 and as would be apparent to one of ordinary skill in the art from the description herein. Additionally, the voltage at the terminals of the MOSFETs in the second shifting stage 106 in FIG. 2 are biased similarly to the first shifting stage 104 in FIG. 1, as shown in FIG. 2 and as would be apparent to one of ordinary skill in the art from the description herein.

Thus, the level shifter 100 shifts the high core voltage of 1.5 V at the core input 102 to the high shifted voltage of 3.3 V at the second coupling node 214 while limiting the gate oxide voltage of each of the MOSFETs within the level shifter 100 to be below the voltage of 1.65 V. Thus, the level shifter 100 may be implemented using thin gate oxide MOSFETs designed for use in a digital system having low operating voltages.

Figure 3:
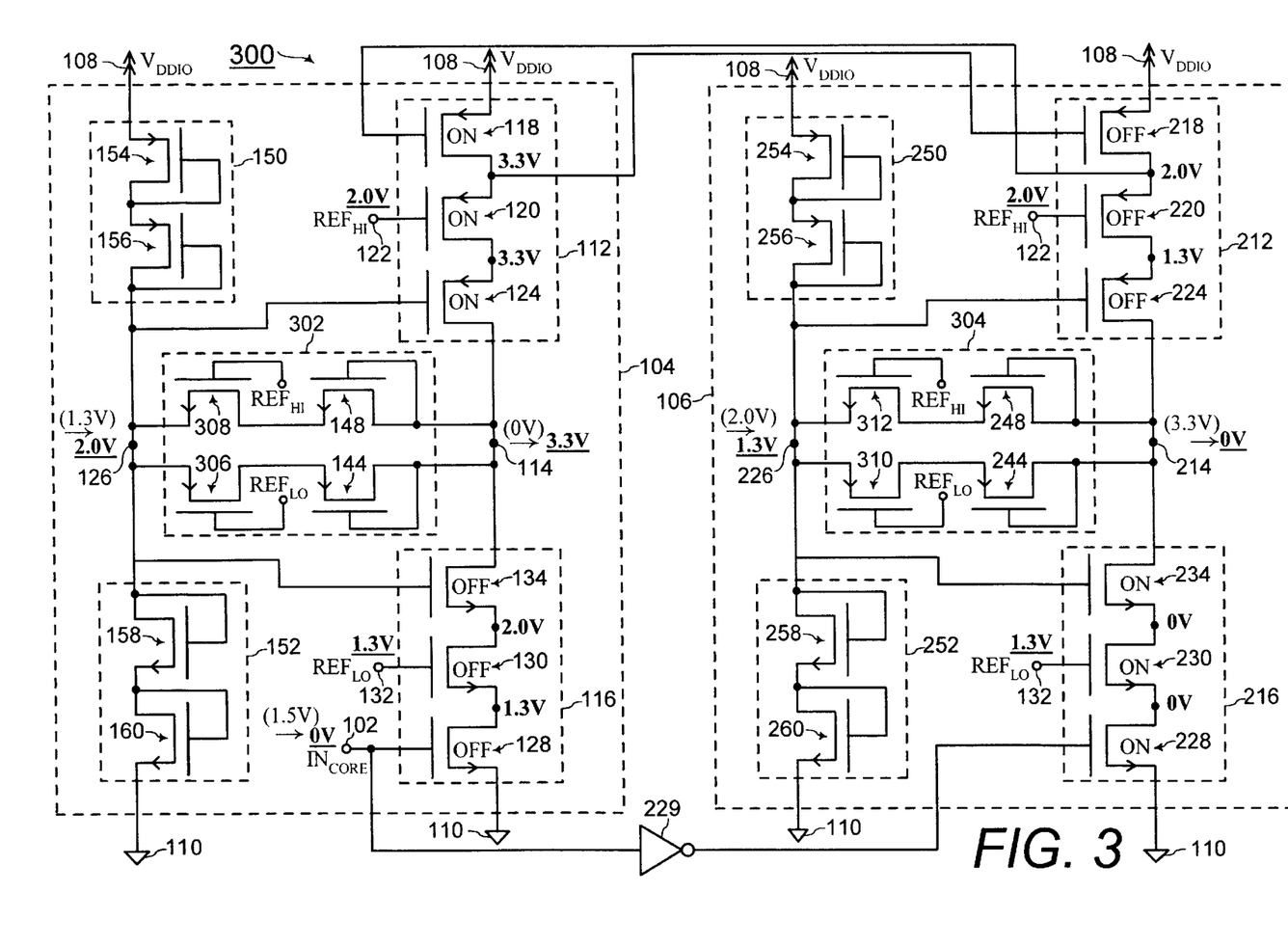
FIG. 3 shows a second embodiment of the present invention when a level shifter of the present invention shifts the low core voltage from the digital system to the higher external voltage range of the external system.

Referring to FIG. 3, an alternative embodiment of a level shifter 300 of the present invention is shown. The level shifter 300 of FIG. 3 is similar to the level shifter 100 of FIG. 1 when the low core voltage of 0 V is at the core input 102. Elements having the same reference number in FIGS. 1 and 3 refer to elements having similar structure and function. FIG. 3 shows the operation of the level shifter 300 when the low core voltage of 0 V is at the core input 102. The first and second pull-up stacks 112 and 212, the first and second pull-down stacks 116 and 216, the first and second pull-up bleeding circuits 150 and 250, and the first and second pull-down bleeding circuits 152 and 252 in the level shifter 300 of FIG. 3 operate in similar manner to those in the level shifter 100 of FIG. 1 when the low core voltage of 0 V is at the core input 102.

However, a first clamping circuit 302 and a second clamping circuit 304 of FIG. 3 are different from the first clamping circuit 140 and the second clamping circuit 240 respectively of FIG. 1. The first clamping circuit 302 of FIG. 3 includes a referenced connected PMOSFET 306. The gate of the reference connected PMOSFET 306 is coupled to the low reference voltage 132, and the source of the referenced connected PMOSFET 306 is coupled to the first predetermined node 126. The drain of the reference connected PMOSFET 306 is coupled in series with the diode connected PMOSFET 144 within the first clamping circuit 302.

The first clamping circuit 302 also includes a referenced connected NMOSFET 308. The gate of the reference connected NMOSFET 308 is coupled to the high reference voltage 122, and the source of the referenced connected NMOSFET 308 is coupled to the first predetermined node 126. The drain of the reference connected NMOSFET 308 is coupled in series with the diode connected NMOSFET 148 within the first clamping circuit 302.

Referring to FIG. 3, as the first coupling node 114 charges up to the high shifted voltage of 3.3 V, the first predetermined node 126 is initially at 1.3 V. Because of this large voltage drop of 2.0 V across the first clamping circuit 302, the diode connected NMOSFET 148 and the reference connected NMOSFET 308 within the first clamping circuit 302 turn on to charge up the first predetermined node 126. Because the gate of the reference connected NMOSFET 308 is coupled to the high reference voltage of 2.0 V, the predetermined node charges up toward 2.0 V when the reference connected NMOSFET 308 and thus the diode connected NMOSFET 148 turn back off.

Similarly, the second clamping circuit 304 of FIG. 3 also includes a referenced connected PMOSFET 310. The gate of the reference connected PMOSFET 310 is coupled to the low reference voltage 132, and the source of the referenced connected PMOSFET 310 is coupled to the second predetermined node 226. The drain of the reference connected PMOSFET 310 is coupled in series with the diode connected PMOSFET 244 within the second clamping circuit 304.

The second clamping circuit 304 also includes a referenced connected NMOSFET 312. The gate of the reference connected NMOSFET 312 is coupled to the high reference voltage 122, and the source of the referenced connected NMOSFET 312 is coupled to the second predetermined node 226. The drain of the reference connected NMOSFET 312 is coupled in series with the diode connected NMOSFET 248 within the second clamping circuit 304.

Referring to FIG. 3, as the second coupling node 214 discharges down to the low shifted voltage of 0 V, the second predetermined node 226 is initially at 2.0 V. Because of this large voltage drop of 2.0 V across the second clamping circuit 304, the diode connected PMOSFET 244 and the reference connected PMOSFET 310 within the second clamping circuit 304 turn on to discharge down the second predetermined node 226. Because the gate of the reference connected PMOSFET 310 is coupled to the low reference voltage of 1.3 V, the second predetermined node 226 discharges down toward 1.3 V when the reference connected PMOSFET 310 and thus the diode connected PMOSFET 244 turn back off.

In this manner, the level shifter 300 of FIG. 3 shifts the low core voltage of 0 V at the core input 102 to the low shifted voltage of 0 V at the second coupling node 214 while limiting the gate oxide voltage of each of the MOSFETs within the level shifter 300 to be below the voltage of 1.65 V. Thus, the level shifter 300 of FIG. 3 may be implemented using thin gate oxide MOSFETs designed for use in a digital system having low operating voltages.

Figure 4:
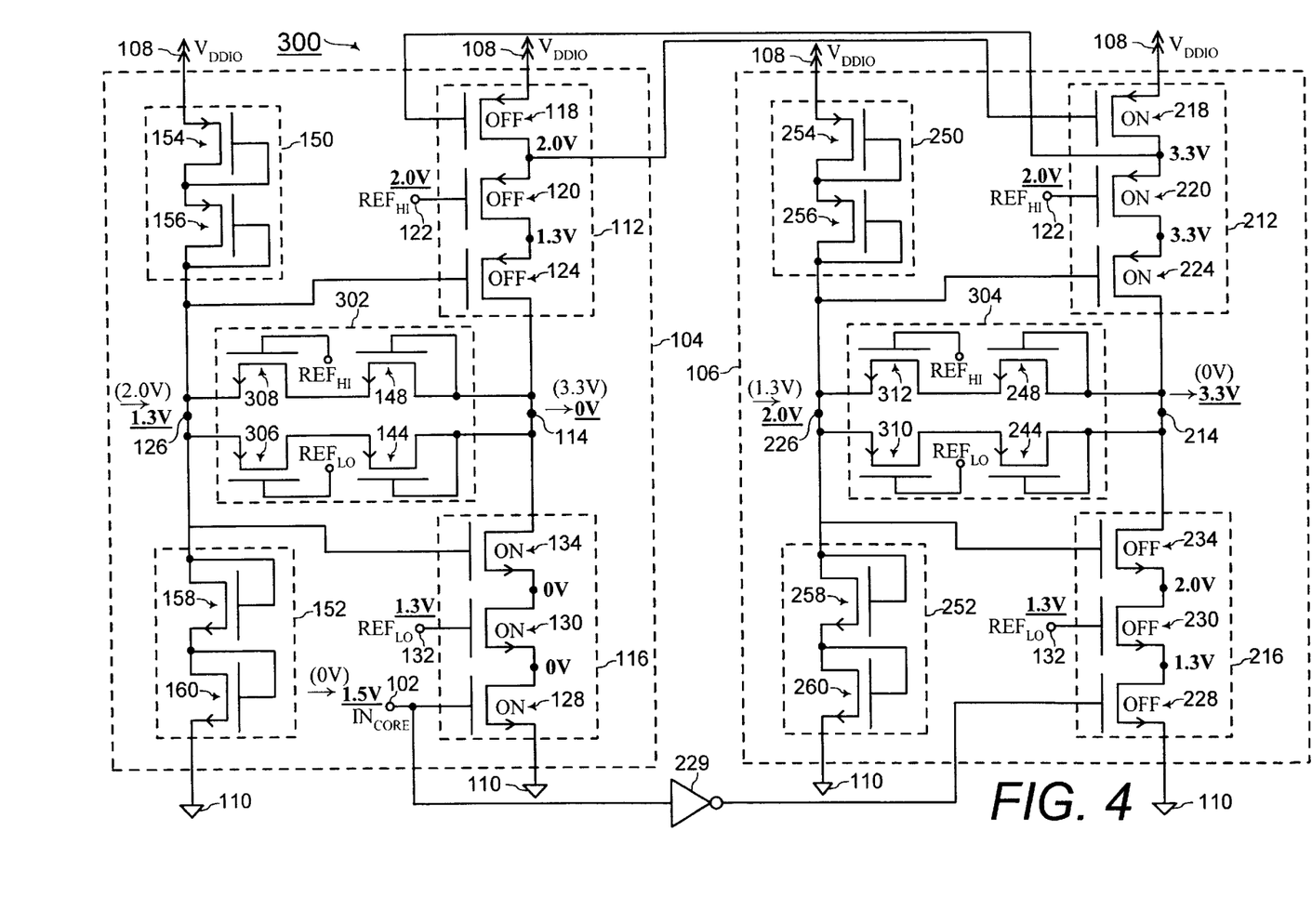
FIG. 4 shows the second embodiment of the present invention as shown in FIG. 3 when the level shifter of the present invention shifts the high core voltage from the digital system to the higher external voltage range of the external system.

Alternatively, FIG. 4 shows operation of the level shifter 300 of FIG. 3 when the high core voltage of 15 V is at the core input 102. Elements having the same reference number in FIGS. 3 and 4 refer to elements having similar structure and function.

The level shifter 300 of FIG. 4 is similar to the level shifter 100 of FIG. 2 when the high core voltage of 1.5 V is at the core input 102. Elements having the same reference number in FIGS. 2 and 4 refer to elements having similar structure and function. FIG. 4 shows the operation of the level shifter 300 when the high core voltage of 1.5 V is at the core input 102. The first and second pull-up stacks 112 and 212, the first and second pull-down stacks 116 and 216, the first and second pull-up bleeding circuits 150 and 250, and the first and second pull-down bleeding circuits 152 and 252 in the level shifter 300 of FIG. 4 operate in similar manner to those in the level shifter 100 of FIG. 2 when the high core voltage of 1.5 V is at the core input 102.

However, the first clamping circuit 302 and the second clamping circuit 304 of FIG. 4 are different from the first clamping circuit 140 and the second clamping circuit 240 respectively of FIG. 2, as described herein with respect to FIG. 3.

Referring to FIG. 4, as the first coupling node 114 discharges down to the low shifted voltage of 0 V, the first predetermined node 126 is initially at 2.0 V. Because of this large voltage drop of 2.0 V across the first clamping circuit 302, the diode connected PMOSFET 144 and the reference connected PMOSFET 306 within the first clamping circuit 302 turn on to discharge down the first predetermined node 126. Because the gate of the reference connected PMOSFET 306 is coupled to the low reference voltage 132 of 1.3 V, the first predetermined node 126 discharges down toward 1.3 V when the reference connected PMOSFET 306 and thus the diode connected PMOSFET 144 turn back off.

Furthermore, as the second coupling node 214 charges up to the high shifted voltage of 3.3 V, the second predetermined node 226 is initially at 1.3 V. Because of this large voltage drop of 2.0 V across the second clamping circuit 304, the diode connected NMOSFET 248 and the reference connected NMOSFET 312 within the second clamping circuit 304 turn on to charge up the second predetermined node 226. Because the gate of the reference connected NMOSFET 312 is coupled to the high reference voltage of 2.0 V, the second predetermined node 226 charges up toward 2.0 V when the reference connected NMOSFET 312 and thus the diode connected NMOSFET 248 turn back off.

In this manner, the level shifter 300 of FIG. 4 shifts the high core voltage of 1.5 V at the core input 102 to the high shifted voltage of 3.3 V at the second coupling node 214 while limiting the gate oxide voltage of each of the MOSFETs within the level shifter 300 to be below the voltage of 1.65 V. Thus, the level shifter 300 of FIG. 4 may also be implemented using thin gate oxide MOSFETs designed for use in a digital system having low operating voltages.

Figure 5:
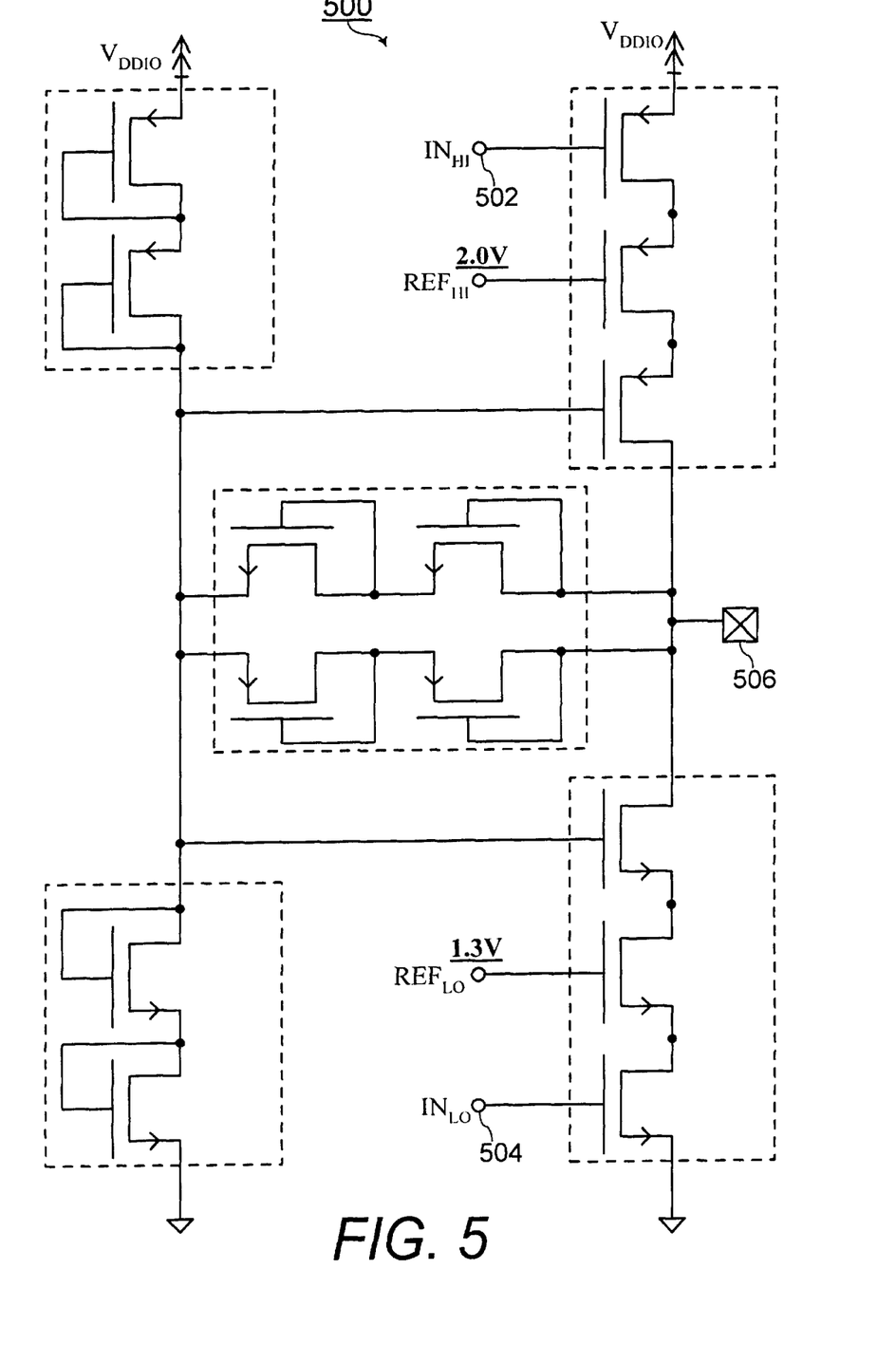
FIG. 5 shows an output buffer which is coupled to the level shifter of the present invention for driving an output pad, that is coupled to the external system.

The level shifter circuit 100 of FIGS. 1 and 2 and the level shifter circuit 300 of FIGS. 3 and 4 may be coupled to output buffers as disclosed in a patent application entitled "Output Buffer with Protective Limit of Voltage across Terminals of Devices within the Output Buffer" with Ser. No. 09/165,489 and filed concurrently herewith and having common inventor and assignee herewith. This patent application with Ser. No. 09/165,489 is incorporated herein by reference. FIG. 5 shows one example of such an output buffer 500 which operates as described in patent application with Ser. No. 09/165,489.

The level shifters 100 and 300 of the present invention are coupled to a high voltage input 502 and a low voltage input 504 in the output buffer 500 of FIG. 5. The node of the drain of the second top PMOSFET 218 of the level shifters 100 and 300 of the present invention is coupled to the high voltage input 502 of the output buffer 500.

The node of the drain of the second bottom NMOSFET 228 of the level shifters 100 and 300 of the present invention is coupled to the low voltage input 504 of the output buffer 500.

With such coupling, a voltage of 2.0 V is coupled to the high voltage input 502 and a voltage of 0 V is coupled to the low voltage input 504 when the low core voltage of 0 V is at the core input 102. In this manner, the output buffer 500 drives an output pad 506 to 0 V when the low core voltage of 0 V is at the core input 102, as described in patent application with Ser. No. 09/165,489.

Alternatively, a voltage of 3.3 V is coupled to the high voltage input 502 and a voltage of 1.3 V is coupled to the low voltage input 504 when the high core voltage of 1.5 V is at the core input 102. In this manner, the output buffer 500 drives the output pad 506 to 3.3 V when the high core voltage of 1.5 V is at the core input 102, as described in patent application with Ser. No. 09/165,489.

The output buffer 500 may be desired for interfacing a digital system to an output pad 506 coupled to an external system when a high slew rate is required for charging and discharging the output pad 506. In that case, the dimension of the MOSFETs within the output buffer 500 are designed with high width for providing sufficient current for the desired slew rate. The level shifters 100 and 300 of the present invention may be used with any other types of output buffers.

The foregoing is by way of example only and is not intended to be limiting. The voltage levels mentioned in the description herein are only approximate and are by way of example only. Other voltage levels may be produced with the level shifters of the present invention, as would be apparent to one of ordinary skill in the art from the description herein. The number of MOSFETs within the pull-up stacks, the pull-down stacks, the clamping circuits, the pull-up bleeding circuits, and the pull-down bleeding circuits are by way of example only. Other number of MOSFETs may be used to produce other voltage levels, as would be apparent to one of ordinary skill in the art from the description herein. Furthermore, the present invention may be used for digital systems and level shifters implemented with any other type of devices, aside from just MOSFETs for example, having similar operating characteristics as MOSFETs, as would be apparent to one of ordinary skill in the art from the description herein. The invention is limited only as defined in the following claims and equivalents thereof.

I claim:

1. A level shifter for shifting a core range of core input voltage between a low core voltage and a high core voltage to a shifted range between a low shifted voltage and a high shifted voltage, while limiting voltage across terminals of devices within said level shifter, said level shifter comprising:

a first shifting stage including:

a first pull-up stack of a first plurality of pull-up devices, coupled between a high power supply and a first coupling node, the first plurality of pull-up devices turning on when the first coupling node is driven to the high shifted voltage that is substantially the voltage at the high power supply and turning off when the first coupling node is driven to the low shifted voltage that is substantially the voltage at a low power supply, wherein a voltage difference between the first coupling node and the high power supply is distributed across said first plurality of pull-up devices when the first coupling node is driven to the low shifted voltage;

a first pull-down stack of a first plurality of pull-down devices, coupled between the low power supply and the first coupling node, the first plurality of pull-down devices turning on when the first coupling node is driven to the low shifted voltage and turning off when the first coupling node is driven to the high shifted voltage, wherein a voltage difference between the first coupling node and the low power supply is distributed across said first plurality of pull-down devices when the first coupling node is driven to the high shifted voltage; and a first clamping circuit, coupled to the first coupling node and to a first predetermined node of the first plurality of pull-up and pull-down devices, for limiting voltage across terminals of each of the first plurality of pull-up and pull-down devices by discharging down said first predetermined node when the first coupling node is driven to the low shifted voltage and by charging up said first predetermined node when the first coupling node is driven to the high shifted voltage; and said level shifter further comprising a second shifting stage including:

a second pull-up stack of a second plurality of pull-up devices, coupled between the high power supply and a second coupling node, the second plurality of pull-up devices turning on when the second coupling node is driven to the high shifted voltage and turning off when the second coupling node is driven to the low shifted voltage, wherein a voltage difference between the second coupling node and the high power supply is distributed across said second plurality of pull-up devices when the second coupling node is driven to the low shifted voltage;

a second pull-down stack of a second plurality of pull-down devices, coupled between the low power supply and the second coupling node, the second plurality of pull-down devices turning on when the second coupling node is driven to the low shifted voltage and turning off when the second coupling node is driven to the high shifted voltage, wherein a voltage difference between the second coupling node and the low power supply is distributed across said second plurality of pull-down devices when the second coupling node is driven to the high shifted voltage; and a second clamping circuit, coupled to the second coupling node and to a second predetermined node of the second plurality of pull-up and pull-down devices, for limiting voltage across terminals of each of the second plurality of pull-up and pull-down devices by discharging down said second predetermined node when the second coupling node is driven to the low shifted voltage and by charging up said second predetermined node when the second coupling node is driven to the high shifted voltage;

and wherein one of the first plurality of pull-up devices is cross-coupled to one of the second plurality of pull-up devices, and wherein the core input voltage is coupled to one of the first plurality of pull-down devices, and wherein the core input voltage is coupled via an inverter to one of the second plurality of pull-down devices, such that the first coupling node is driven to the low shifted voltage and the second coupling node is driven to the high shifted voltage when the core input voltage is the high core voltage, and such that the first coupling node is driven to the high shifted voltage and the second coupling node is driven to the low shifted voltage when the core input voltage is the low core voltage, and wherein the shifted range between the low shifted voltage and the high shifted voltage is higher than the core range between the low core voltage and the high core voltage.

2. The level shifter of claim 1, wherein:

said first pull-up stack is comprised of a first plurality of PMOSFETs (P-channel Metal Oxide Semiconductor Field Effect Transistors) coupled in series between the high power supply and the first coupling node, and wherein said second pull-up stack is comprised of a second plurality of PMOSFETs (P-channel Metal Oxide Semiconductor Field Effect Transistors) coupled in series between the high power supply and the second coupling node, and wherein the source of a first top PMOSFET of said first plurality of PMOSFETs and the source of a second top PMOSFET of said second plurality of PMOSFETs are coupled to the high power supply, and wherein the first top PMOSFET is cross-coupled to the second top PMOSFET with the gate of the first top PMOSFET being coupled to the drain of the second top PMOSFET and with the drain of the first top PMOSFET being coupled to the gate of the second top PMOSFET, and wherein the gate of a first middle PMOSFET of said first plurality of PMOSFETs and the gate of a second middle PMOSFET of said second plurality of PMOSFETs are coupled to a high reference voltage, and wherein the gate of a first bottom PMOSFET of said first plurality of PMOSFETs is coupled to the first predetermined node and the drain of the first bottom PMOSFET is coupled to the first coupling node, and wherein the gate of a second bottom PMOSFET of said second plurality of PMOSFETs is coupled to the second predetermined node and the drain of the second bottom PMOSFET is coupled to the second coupling node.

3. The level shifter of claim 1, wherein:

said first pull-down stack is comprised of a first plurality of NMOSFETs (N-channel Metal Oxide Semiconductor Field Effect Transistors) coupled in series between the low power supply and the first coupling node, and wherein said second pull-down stack is comprised of a second plurality of NMOSFETs (N-channel Metal Oxide Semiconductor Field Effect Transistors) coupled in series between the low power supply and the second coupling node, and wherein the source of a first bottom NMOSFET of said first plurality of NMOSFETs and the source of a second bottom NMOSFET of said second plurality of NMOSFETs are coupled to the low power supply, and wherein the gate of the first bottom NMOSFET is coupled to the core input voltage, and wherein the gate of the second bottom NMOSFET is coupled via said inverter to the core input voltage, and wherein the gate of a first middle NMOSFET of said first plurality of NMOSFETs and the gate of a second middle NMOSFET of said second plurality of NMOSFETs arc coupled to a low reference voltage, and wherein the gate of a first top NMOSFET of said first plurality of NMOSFETs is coupled to the first predetermined node and the drain of the first top NMOSFET is coupled to the first coupling node, and wherein the gate of a second top NMOSFET of said second plurality of NMOSFETs is coupled to the second predetermined node and the drain of the second top NMOSFET is coupled to the second coupling node.

4. The level shifter of claim 1, wherein said first clamping circuit comprises:

a plurality of diode connected PMOSFETs, coupled in series between the first coupling node and the first predetermined node, that turn on to discharge down the first predetermined node when the first coupling node is driven to the low shifted voltage; and a plurality of diode connected NMOSFETs, coupled in series between the first coupling node and the first predetermined node, that turn on to charge up the first predetermined node when the first coupling node is driven to the high shifted voltage.

5. The level shifter of claim 1, wherein said second clamping circuit comprises:

a plurality of diode connected PMOSFETs, coupled in series between the second coupling node and the second predetermined node, that turn on to discharge down the second predetermined node when the second coupling node is driven to the low shifted voltage; and a plurality of diode connected NMOSFETs, coupled in series between the second coupling node and the second predetermined node, that turn on to charge up the second predetermined node when the second coupling node is driven to the high shifted voltage.

6. The level shifter of claim 1, wherein said first clamping circuit comprises:

a first pull-up bleeding circuit, coupled between the first predetermined node and the high power supply, for bleeding charge on to the first predetermined node to maintain voltage at the first predetermined node above a minimum voltage; and a first pull-down bleeding circuit, coupled between the first predetermined node and the low power supply, for bleeding charge away from the first predetermined node to maintain voltage at the first predetermined node below a maximum voltage.

7. The level shifter of claim 6, wherein:

said first pull-up bleeding circuit is comprised of a plurality of diode connected PMOSFETs coupled in series between said first predetermined node and said high power supply; and wherein said first pull-down bleeding circuit is comprised of a plurality of diode connected NMOSFETs coupled in series between said first predetermined node and said low power supply.

8. The level shifter of claim 1, wherein said second clamping circuit comprises:

a pull-up bleeding circuit, coupled between the second predetermined node and the high power supply, for bleeding charge on to the second predetermined node to maintain voltage at the second predetermined node above a minimum voltage; and a pull-down bleeding circuit, coupled between the second predetermined node and the low power supply, for bleeding charge away from the second predetermined node to maintain voltage at the second predetermined node below a maximum voltage.

9. The level shifter of claim 8, wherein:

said pull-up bleeding circuit is comprised of a plurality of diode connected PMOSFETs coupled in series between said second predetermined node and said high power supply; and wherein said pull-down bleeding circuit is comprised of a plurality of diode connected NMOSFETs coupled in series between said second predetermined node and said low power supply.

10. The level shifter of claim 1, wherein said first clamping circuit comprises:

a reference connected PMOSFET, having a source coupled to the first predetermined node and having a gate coupled to a low reference voltage;

at least one diode connected PMOSFET, coupled between the first coupling node and the drain of said reference connected PMOSFET;

wherein the reference connected PMOSFET and the at least one diode connected PMOSFET turn on to discharge down said first predetermined node when the first coupling node is driven to the low shifted voltage;

a reference connected NMOSFET, having a source coupled to the first predetermined node and having a gate coupled to a high reference voltage; and at least one diode connected NMOSFET, coupled between the first coupling node and the drain of said reference connected NMOSFET;

wherein the reference connected NMOSFET and the at least one diode connected NMOSFET turn on to charge up said first predetermined node when the first coupling node is driven to the high shifted voltage.

11. The level shifter of claim 1, wherein said second clamping circuit comprises:

a reference connected PMOSFET, having a source coupled to the second predetermined node and having a gate coupled to a low reference voltage;

at least one diode connected PMOSFET, coupled between the second coupling node and the drain of said reference connected PMOSFET;

wherein the reference connected PMOSFET and the at least one diode connected PMOSFET turn on to discharge down said second predetermined node when the second coupling node is driven to the low shifted voltage;

a reference connected NMOSFET, having a source coupled to the second predetermined node and having a gate coupled to a high reference voltage; and at least one diode connected NMOSFET, coupled between the second coupling node and the drain of said reference connected NMOSFET;

wherein the reference connected NMOSFET and the at least one diode connected NMOSFET turn on to charge up said second predetermined node when the second coupling node is driven to the high shifted voltage.

12. A method for shifting with a level shifter a core range of core input voltage between a low core voltage and a high core voltage to a shifted range between a low shifted voltage and a high shifted voltage, while limiting voltage across terminals of devices within said level shifter, the method including the steps of:

turning on a first pull-up stack of a first plurality of pull-up devices when a first coupling node is driven to the high shifted voltage and turning off said first pull-up stack of the first plurality of pull-up devices when the first coupling node is driven to the low shifted voltage, wherein said first pull-up stack of the first plurality of pull-up devices is coupled between a high power supply and the first coupling node such that a voltage difference between the first coupling node and the high power supply is distributed across said first plurality of pull-up devices when the first coupling node is driven to the low shifted voltage;

turning on a first pull-down stack of a first plurality of pull-down devices when the first coupling node is driven to the low shifted voltage and turning off said first pull-down stack of the first plurality of pull-down devices when the first coupling node is driven to the high shifted voltage, wherein said first pull-down stack of the first plurality of pull-down devices is coupled between a low power supply and the first coupling node such that a voltage difference between the first coupling node and the low power supply is distributed across said first plurality of pull-down devices when the first coupling node is driven to the high shifted voltage, wherein the high shifted voltage is substantially the voltage at the high power supply and wherein the low shifted voltage is substantially the voltage at the low power supply;

limiting voltage across terminals of each of the first plurality of pull-up and pull-down devices by discharging down a first predetermined node, coupled to the first plurality of pull-up and pull-down devices, when the first coupling node is driven to the low shifted voltage and by charging up said first predetermined node when the first coupling node is driven to the high shifted voltage;

turning on a second pull-up stack of a second plurality of pull-up devices when a second coupling node is driven to the high shifted voltage and turning off said second pull-up stack of the second plurality of pull-up devices when the second coupling node is driven to the low shifted voltage, wherein said second pull-up stack of the second plurality of pull-up devices is coupled between a high power supply and the second coupling node such that a voltage difference between the second coupling node and the high power supply is distributed across said second plurality of pull-up devices when the second coupling node is driven to the low shifted voltage;

turning on a second pull-down stack of a second plurality of pull-down devices when the second coupling node is driven to the low shifted voltage and turning off said second pull-down stack of the second plurality of pull-down devices when the second coupling node is driven to the high shifted voltage, wherein said second pull-down stack of the second plurality of pull-down devices is coupled between the low power supply and the second coupling node such that a voltage difference between the second coupling node and the low power supply is distributed across said second plurality of pull-down devices when the second coupling node is driven to the high shifted voltage; and limiting voltage across terminals of each of the second plurality of pull-up and pull-down devices by discharging down a second predetermined node, coupled to the second plurality of pull-up and pull-down devices, when the second coupling node is driven to the low shifted voltage and by charging up said second predetermined node when the second coupling node is driven to the high shifted voltage, and wherein one of the first plurality of pull-up devices is cross-coupled to one of the second plurality of pull-up devices, and wherein the core input voltage is coupled to one of the first plurality of pull-down devices, and wherein the core input voltage is coupled via an inverter to one of the second plurality of pull-down devices, such that the first coupling node is driven to the low shifted voltage and the second coupling node is driven to the high shifted voltage when the core input voltage is the high core voltage, and such that the first coupling node is driven to the high shifted voltage and the second coupling node is driven to the low shifted voltage when the core input voltage is the low core voltage, and wherein the shifted range between the low shifted voltage and the high shifted voltage is higher than the core range between the low core voltage and the high core voltage.

13. The method of claim 12, wherein:

said first pull-up stack is comprised of a first plurality of PMOSFETs (P-channel Metal Oxide Semiconductor Field Effect Transistors) coupled in series between the high power supply and the first coupling node, and wherein said second pull-up stack is comprised of a second plurality of PMOSFETs (P-channel Metal Oxide Semiconductor Field Effect Transistors) coupled in series between the high power supply and the second coupling node, and wherein the source of a first top PMOSFET of said first plurality of PMOSFETs and the source of a second top PMOSFET of said second plurality of PMOSFETs are coupled to the high power supply, and wherein the first top PMOSFET is cross-coupled to the second top PMOSFET with the gate of the first top PMOSFET being coupled to the drain of the second top PMOSFET and with the drain of the first top PMOSFET being coupled to the gate of the second top PMOSFET, and wherein the gate of a first middle PMOSFET of said first plurality of PMOSFETs and the gate of a second middle PMOSFET of said second plurality of PMOSFETs are coupled to a high reference voltage, and wherein the gate of a first bottom PMOSFET of said first plurality of PMOSFETs is coupled to the first predetermined node and the drain of the first bottom PMOSFET is coupled to the first coupling node, and wherein the gate of a second bottom PMOSFET of said second plurality of PMOSFETs is coupled to the second predetermined node and the drain of the second bottom PMOSFET is coupled to the second coupling node.

14. The method of claim 12, wherein:

said first pull-down stack is comprised of a first plurality of NMOSFETs (N-channel Metal Oxide Semiconductor Field Effect Transistors) coupled in series between the low power supply and the first coupling node, and wherein said second pull-down stack is comprised of a second plurality of NMOSFETs (N-channel Metal Oxide Semiconductor Field Effect Transistors) coupled in series between the low power supply and the second coupling node, and wherein the source of a first bottom NMOSFET of said first plurality of NMOSFETs and the source of a second bottom NMOSFET of said second plurality of NMOSFETs are coupled to the low power supply, and wherein the gate of the first bottom NMOSFET is coupled to the core input voltage, and wherein the gate of the second bottom NMOSFET is coupled via said inverter to the core input voltage, and wherein the gate of a first middle NMOSFET of said first plurality of NMOSFETs and the gate of a second middle NMOSFET of said second plurality of NMOSFETs are coupled to a low reference voltage, and wherein the gate of a first top NMOSFET of said first plurality of NMOSFETs is coupled to the first predetermined node and the drain of the first top NMOSFET is coupled to the first coupling node, and wherein the gate of a second top NMOSFET of said second plurality of NMOSFETs is coupled to the second predetermined node and the drain of the second top NMOSFET is coupled to the second coupling node.

15. The method of claim 12, wherein said step of limiting voltage across terminals of each of the first plurality of pull-up and pull-down devices further includes the steps of:

turning on a plurality of diode connected PMOSFETs, coupled in series between the first coupling node and said first predetermined node, to discharge down said first predetermined node when the first coupling node is driven to the low shifted voltage; and turning on a plurality of diode connected NMOSFETs, coupled in series between the first coupling node and said first predetermined node, to charge up said first predetermined node when the first coupling node is driven to the high shifted voltage.

16. The method of claim 15, wherein said step of limiting voltage across terminals of each of the first plurality of pull-up and pull-down devices further includes the steps of:

bleeding charge via a pull-up bleeding circuit on to the first predetermined node from the high power supply to maintain voltage at the first predetermined node above a minimum voltage; and bleeding charge via a pull-down bleeding circuit away from the first predetermined node and to the low power supply to maintain voltage at the first predetermined node below a maximum voltage.

17. The method of claim 12, wherein said step of limiting voltage across terminals of each of the second plurality of pull-up and pull-down devices further includes the steps of:

turning on a plurality of diode connected PMOSFETs, coupled in series between the second coupling node and said second predetermined node, to discharge down said second predetermined node when the second coupling node is driven to the low shifted voltage; and turning on a plurality of diode connected NMOSFETs, coupled in series between the second coupling node and said second predetermined node, to charge up said second predetermined node when the second coupling node is driven to the high shifted voltage.

18. The method of claim 17, wherein said step of limiting voltage across terminals of each of the second plurality of pull-up and pull-down devices further includes the steps of:

bleeding charge via a pull-up bleeding circuit on to the second predetermined node from the high power supply to maintain voltage at the second predetermined node above a minimum voltage; and bleeding charge via a pull-down bleeding circuit away from the second predetermined node and to the low power supply to maintain voltage at the second predetermined node below a maximum voltage.

19. The method of claim 12, wherein said step of limiting voltage across terminals of each of the first plurality of pull-up and pull-down devices further includes the steps of:

turning on a reference connected PMOSFET and at least one diode connected PMOSFET to discharge down said first predetermined node when the first coupling node is driven to the low shifted voltage, wherein the source of the reference connected PMOSFET is coupled to the first predetermined node and wherein the gate of the reference connected PMOSFET is coupled to a low reference voltage, and wherein the at least one diode connected PMOSFET is coupled between the first coupling node and the drain of the reference connected PMOSFET; and turning on a reference connected NMOSFET and at least one diode connected NMOSFET to charge up said first predetermined node when the first coupling node is driven to the high shifted voltage, wherein the source of the reference connected NMOSFET is coupled to the first predetermined node and the gate of the reference connected NMOSFET is coupled to a high reference voltage, and wherein the at least one diode connected NMOSFET is coupled between the first coupling node and the drain of the reference connected NMOSFET.

20. The method of claim 19, wherein said step of limiting voltage across terminals of each of the first plurality of pull-up and pull-down devices further includes the steps of:

bleeding charge via a pull-up bleeding circuit on to the first predetermined node from the high power supply to maintain voltage at the first predetermined node above a minimum voltage; and bleeding charge via a pull-down bleeding circuit away from the first predetermined node and to the low power supply to maintain voltage at the first predetermined node below a maximum voltage.

21. The method of claim 12, wherein said step of limiting voltage across terminals of each of the second plurality of pull-up and pull-down devices further includes the steps of:

turning on a reference connected PMOSFET and at least one diode connected PMOSFET to discharge down said second predetermined node when the second coupling node is driven to the low shifted voltage, wherein the source of the reference connected PMOSFET is coupled to the second predetermined node and wherein the gate of the reference connected PMOSFET is coupled to a low reference voltage, and wherein the at least one diode connected PMOSFET is coupled between the second coupling node and the drain of the reference connected PMOSFET; and turning on a reference connected NMOSFET and at least one diode connected NMOSFET to charge up said second predetermined node when the second coupling node is driven to the high shifted voltage, wherein the source of the reference connected NMOSFET is coupled to the second predetermined node and the gate of the reference connected NMOSFET is coupled to a high reference voltage, and wherein the at least one diode connected NMOSFET is coupled between the second coupling node and the drain of the reference connected NMOSFET.

22. The method of claim 21, wherein said step of limiting voltage across terminals of each of the second plurality of pull-up and pull-down devices further includes the steps of:

bleeding charge via a pull-up bleeding circuit on to the second predetermined node from the high power supply to maintain voltage at the second predetermined node above a minimum voltage; and bleeding charge via a pull-down bleeding circuit away from the second predetermined node and to the low power supply to maintain voltage at the second predetermined node below a maximum voltage.

* * * * *